United States Patent Office
3,728,119
Patented Apr. 17, 1973

3,728,119

PRODUCTION OF POSITIVE COPPER IMAGES UTILIZING PHOTOSENSITIVE LEAD COMPOUNDS

Johan Eugeen Vanhalst, Wilrijk, Walter August Van den Heuvel, Berchem, and Eric Maria Brinckman, Mortsel, Belgium, assignors to Agfa-Gevaert N.V., Mortsel, Belgium No Drawing. Filed Feb. 16, 1971, Ser. No. 115,808
Claims priority, application Great Britain, Feb. 17, 1970, 7,584/70
Int. Cl. G03c *5/24*
U.S. Cl. 96—48 R 7 Claims

ABSTRACT OF THE DISCLOSURE

An image reproduction system is provided using a photosensitive recording material containing a photosensitive lead compound capable of separating metallic lead on exposure to activating electromagnetic radiation. The lead compound stands in working contact with a reducing agent capable to promote the formation of metallic lead in the exposed portions. In a first step a print-out lead image is formed. In a second step the print-out lead image is removed and simultaneously a positive copper metal image is formed by a treatment with an aqueous copper (II) solution. As photosensitive lead compounds yellow lead(II) oxide and lead(II) iodide are preferred. The formation of metallic lead is promoted by ascorbic acid and the formation of metallic copper by sodium dithionite.

The present invention relates to a photographic process for the production of positive non-silver images.

The formation and development of latent silver images is generally known. The replacement of silver in photography by non-silver-containing light-sensitive substances has been made the object of an intensive research in order to lower the cost of the photographic materials.

The photographic system of the present invention is based on the photosensitivity of particular lead compounds that can form a print-out image on exposure to active electro-magnetic radiation.

Among photo-sensitive metal compounds other than silver, lead compounds such as lead iodide, lead azide or lead bromide have proved to be valuable as mentioned e.g. in the U.S. patent specification No. 2,414,839.

The use of lead(II) oxide in xerography is known e.g. from the U.S. patent specification No. 3,008,825.

Two types of photosensitive lead(II) oxide exist viz the commercially available lead(II) oxide, which is a yellow pigment having an orthorhombic crystalline structure, also called massicot, and the red to tan lead(II) oxide, which possesses a tetragonal crystalline structure, also called litharge.

The photo-sensititive lead compounds used according to the present invention are of the type that can form a print-out lead image on exposure to active electromagnetic radiation. In that respect reference is made to photosensitive lead halides such as lead bromide and lead iodide and the yellow lead(II) oxide.

The photographic process according to the present invention provides the possibility to produce positive prints from positive originals and is characterized by the steps of:

(1) exposing a photosensitive recording material containing a photosensitive lead compound capable of separating metallic lead on exposure to active electromagnetic radiation to such radiation while having the photosensitive lead compound in working contact with a reducing agent capable to promote the formation of metallic lead in the exposed portions, (2) treating the obtained print-out image with copper(II) ions till the metallic lead image has disappeared or substantially disappeared, (3) treating the recording material with a reducing agent that is capable to separate metallic copper from an aqueous copper(II) sulphate solution, thereby producing a positive image together with a relatively weak negative image that in an optional additional step is removed.

In the process according to the present invention preferably lead(II) iodide and/or yellow lead(II) oxide is used as photosensitive lead compound.

The grain size of the photosensitive lead compounds is preferably as fine as possible. A suitable particle size is in the range of 0.03 and 10 micron.

Lead iodide can be prepared in finely divided state occasionally in the presence of a water-soluble binding agent, e.g. by a reaction of a dissolved water-soluble lead compound e.g. lead acetate with sodium iodide.

The yellow lead(II) oxide used according to the present invention may be doped with metals e.g. bismuth, molybdenum, lanthanum, copper and silver.

Preference is given to bismuth doped yellow lead(II) oxide powder the grain size of which expressed in specific surface per weight is preferably at least 0.30 sq. m. per gram.

Since the electrical resistivity of the print-out recording material according to the present invention is of no importance in the image-formation as is the case in electrophotography binding agents with low as well as with high electrical resistivity can be used with the proviso, however, that the recording layer has to be still liquid permeable.

A water-permeable structure of the recording layer can be obtained e.g. by using a water-permeable binding agent or binding agent composition, or by using a binding agent or binding agent composition by means of which on drying porous coatings are produced.

According to a preferred embodiment the lead(II) oxide grains are used in admixture with a so-called chemical sensitizing agent. It has been found that a marked increase of print-out photosensitivity is obtained by using the lead(II) oxide in admixture with an organic polyfunctional compound, of which at least two chemical functional groups are hydroxy and/or mercapto and/or primary or secondary amino groups.

Particularly preferred organic polyfunctional compounds have at least one hydroxy group or neighbouring hydroxy, mercapto, primary or secondary amino groups as e.g. in 1,2-diol compounds, 1,2-hydroxyamino compounds, 1,2-mercapto hydroxy compounds, 1,2-mercapto amino compounds or 1,2-diamino compounds. Hydrogen in one of the 1,2 positioned or ortho-groups can be replaced by a substituent e.g. an aliphatic group preferably an alkyl group.

A particularly valuable chemical sensitization is obtained by using for 1 mole of lead(II) oxide an amount of said polyfunctional organic compound in the range of 0.01 to 1.5 equivalent calculated on the basis of the hydroxy, mercapto, primary amino or secondary amino functional groups contained therein. Optimal sensitizing results are obtained with a said polyfunctional organic compound that contains at least one hydroxy group and is used in an amount of 1 mole divided by the number of hydroxy groups present in the polyfunctional molecule per mole of photosensitive lead(II) oxide. For example 0.5 mole of diethanolamine is used in admixture with 1 mole of lead(II) oxide.

Chemical sensitizers for the recording element containing photosensitive lead(II) oxide in dry as well as in wet state correspond to the following general formulae:

(1) $X_1—Q_1—X_2$ (2) 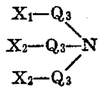

wherein:

each of $X_1$ and $X_2$ stands for —OH, —SH, —NHR, —$CH_2$OH, —$CH_2$SH, —$CH_2$NHR, —COR, —C(R)$_3$, a cyclic amino group, e.g. a

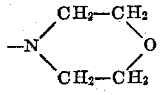

or a

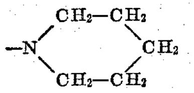

or halogen, $Q_1$ stands for an alkylene radical including a substituted alkylene radical and an alkylene radical interrupted with one or more heteroatoms, e.g. oxygen, sulphur, or a group containing heteroatoms such as a

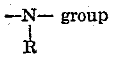

or a bivalent alkenyl radical, e.g. $Q_1$ represents more particularly a —$CH_2$—C≡C—$CH_2$—,

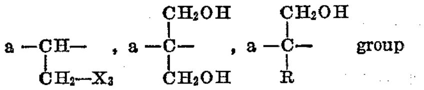

a —($CH_2$—$CH_2$—Y)$_m$—$CH_2$—$CH_2$ group, wherein Y stands for oxygen, sulphur or a

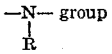

and *m* stands for 1 or 2, or a —(CHOH)$_n$— group wherein *n* stands for a positive integer preferably 1 to 6, $X_3$ stands for —OH, —SH, a —NHR, —$CH_2$OH, —$CH_2$SH or a —$CH_2$NHR group, $Q_3$ stands for a lower ($C_1$–$C_5$) alkylene group, preferably an ethylene, or propylene group, including a substituted ethylene or propylene group e.g. substituted with a hydroxy, an amino, a mercapto or a methyl group, R in the preceding R substituted groups stands for hydrogen or an organic group e.g. an aliphatic group preferably a lower alkyl ($C_1$–$C_5$) group or an aromatic group e.g. a phenyl group.

The present invention includes further the use of mono- and/or oligosaccharides as chemical sensitizers.

Specific examples of chemically sensitizing mono- and oligosaccharides and of chemically sensitizing organic polyfunctional hydroxy, mercapto and amino compounds according to the above general formulae are listed in Table 1 hereinafter.

TABLE 1

| | |
|---|---|
| (1) | $(HOCH_2—CH_2—)_2NH$ |
| (2) | $HOCH_2—CH_2—NH—CH_2—CH_2—NH_2$ |
| (3) | $(HOCH_2—CH_2—)_3N$ |
| (4) | $(HOCH_2—CH_2—)_2N—CH_3$ |
| (5) | 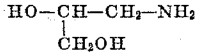 |
| (6) | 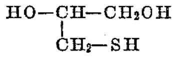 |
| (7) | $HS—CH_2—CH_2—NH_2$ |
| (8) | $(HOCH_2—CH_2—)_2S$ |
| (9) | $HOCH_2—CH_2—NH_2$ |
| (10) | $HOCH_2—CH_2OH$ |

TABLE 1—Continued

| | |
|---|---|
| (11) | $H_2N—CH_2—CH_2—NH_2$ |
| (12) | $(H_2N—CH_2—CH_2—)_2NH$ |
| (13) | 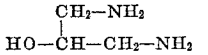 |
| (14) | $(HOCH_2—CH_2—)_2O$ |
| (15) | 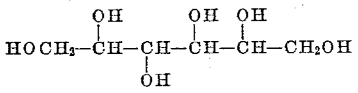 |
| (16) | 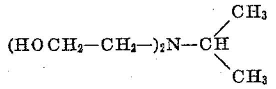 |
| (17) | $O(—CH_2—CH_2—NH_2)_2$ |
| (18) | $HOCH_2—CHOH—CH_2OH$ |
| (19) | Fructose. |
| (20) | Glucose. |
| (21) | Arabinose. |
| (22) | Ribose. |
| (23) | Galactose. |
| (24) | Mannose. |
| (25) | Sucrose. |
| (26) | Xylose. |
| (27) | Raffinose. |
| (28) | 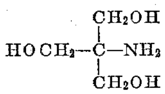 |
| (29) | 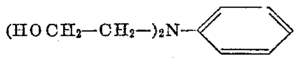 |
| (30) | 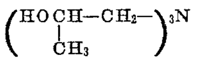 |
| (31) | $HOCH_2—C≡C—CH_2OH$ |
| (32) | $HOCH_2—CH_2SH$ |
| (33) | $(HOCH_2—)_4C$ |
| (34) | $(HOCH_2—)_3C—CH_2—CH_3$ |
| (35) | 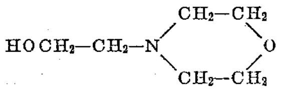 |
| (36) | $HO—(CH_2)_2—O—(CH_2)_2—O—(CH_2)_2—OH$ |
| (37) | $HOCH_2—(CHOH)_4—CH_2OH$ |
| (38) | 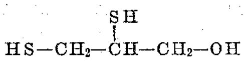 |

Photosensitive lead (II) oxide as well as photosensitive lead(II) iodide can further be chemically sensitized by means of compounds selected from the group consisting of:

(1) thiol compounds or thiolates preferably having a water-soluble character e.g. a thiol compound or thiolate containing a hydrophilic group (a group increasing the water-solubility of the compound) such as a hydroxyl group, or an ionic group, e.g. a free acid, carboxylate or sulphonic acid salt group, (2) compounds corresponding to the following structural formula:

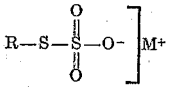

wherein:

$M^+$ represents a cation, e.g. a hydrogen ion, metal ion or onium group but is not present when the radical R already contains a cationic rest (betaine type compound), and R represents an organic group e.g. an alkyl, aryl or heterocyclic group including said groups in substituted state, preferably substituted with a hydrophilic group, e.g. a hydroxyl group, a carboxylate group or a sulphonate group, (3) compounds yielding $HSO_3^-$ ions, or $SO_3^{--}$ ions,
(4) compounds yielding

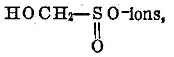

M—O—S—O$^-$ ions wherein M is a cation, or $SO_2^{--}$ ions derived from the hypothetical sulphoxylic acid $S(OH)_2$, and compounds yielding Ar—$SO_2$—S$^-$ ions, wherein Ar represents an aryl group,
(5) compounds yielding $S_2O_4^{--}$ ions,
(6) compounds yielding $SCN^-$ ions, and organic isothiocyanates
(7) compounds containing a

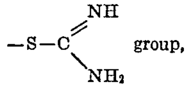

(8) compounds containing a

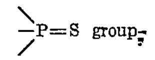

(9) compounds containing a —S—S— group, and compounds containing a —$S_x$— group, wherein $x$ is larger than 2,
(10) compounds containing a —$SR_1$ group, wherein $R_1$ is an organic group linked through carbon to the sulphur atom, e.g. acyl preferably —$COCH_3$, alkyl preferably $C_1$–$C_4$ alkyl, including substituted alkyl, aryl e.g. phenyl, a heterocyclic group, or halogen,
(11) compounds containing a —S—CX=N— group wherein X is an amino or an hydrazino group, and said sulphur-containing group makes part of a heterocyclic ring or ring system,
(12) compounds containing a

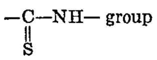

(13) compounds yielding $S_2O_3^{--}$ ions,
(14) xanthates, i.e. salts of xanthic acid having the general formula $R_2O{\cdot}CS{\cdot}SM$, wherein M is a cation and $R_2$ is an alkyl or substituted alkyl group, e.g. a benzyl group,
(15) compounds of As, Sb or Sn known as thiosalts, e.g. $Na_3AsS_4{\cdot}8H_2O$, $K_3AsS_4$, $KAsS_3$, $Na_3SbS_4{\cdot}9H_2O$ and $K_2SnS_3$, or compounds yielding $S^{--}$ ions or M—S$^-$ ions, wherein M is a cation,
(16) selenium or tellurium compounds that contain a releasable selenium or tellurium atom, e.g. allyl tellurourea or allylselenourea, and oxyacids, wherein one or more of the oxygen atoms has been replaced by a selenium or tellurium atom,
(17) N-oxide compounds,
(18) compounds selected from the group consisting of $H_2N$—$CH_2$—COOH, pyridine, tetraalkylammonium hydroxides e.g. tetramethylammonium hydroxide, benzaldehyde and derivatives e.g. 2,4-dichlorobenzaldehyde,
(19) reducing agents as specified in Table 3.

Particularly useful compounds mentioned under (2) are known under the name of Bunte salts. For such compounds and their preparation reference is made to Ang. Chem. 79 Jahrg. (1967), No. 11, pp. 520–529. For preferred strongly hydrophilic representatives of that class reference is made to United Kingdom patent specification No. 1,157,173 wherein new Bunte salts corresponding to the following general formula have been described:

$$MO_3S—L_1—L_2—L_3—S—SO_3M$$

wherein:

$L_1$ represents a methylene group including a substituted methylene group, e.g. alkyl- and aryl-substituted methylene,
$L_2$ represents an alkylene group including a substituted alkylene group such as alkyl- and aryl-substituted alkylene, said alkylene group comprising from 1 to 3 carbon atoms, or
$L_2$ together with $L_1$ stands for the group

wherein Z represents the atoms necessary to close an aromatic nucleus including a substituted aromatic nucleus,
$L_3$ represents a methylene group including a substituted methylene group, e.g. alkyl- and aryl-substituted methylene, and
M stands for a metal atom such as an alkali metal atom or an ammonium group.

Particularly useful compounds as mentioned under (2) to (17) are listed in Table 2 hereinafter.

TABLE 2

| | |
|---|---|
| (1) | $H_5C_2S_2O_3Na$ |
| (2) | 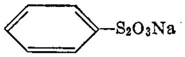 |
| (3) | 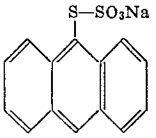 |
| (4) | $H_3^+N—CH_2—CH_2—S_2O_3^-$ |
| (5) | 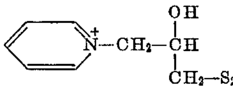 |
| (6) | 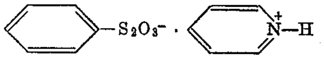 |
| (7) | 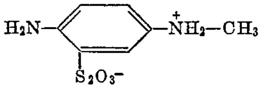 |
| (8) | $NaO—CO—CH_2—S_2O_3Na$ |
| (9) | $O_2S(CH_2—CH_2—S_2O_3Na)_2$ |
| (10) | $ClCH_2—CH(OH)—CH_2—S_2O_3Na$ |
| (11) | $NaO_3S—(CH_2)_3—S_2O_3Na$ |
| (12) | 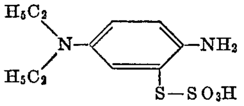 |
| (13) | $NaHSO_3$ |
| (14) | $Na_2SO_3$ |
| (15) | $K_2S_2O_5$ |
| (16) | 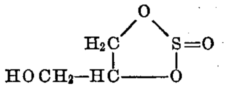 |
| (17) | $O=S(—ONa)—CH_2OH$ |
| (18) | 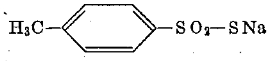 |
| (19) | $Na_2S_2O_4$ |
| (20) | KSCN |
| (21) | $NH_4SCN$ |
| (22) | 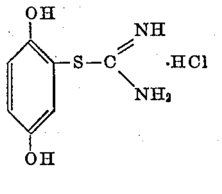 |

TABLE 2—Continued

| | |
|---|---|
| (23) | 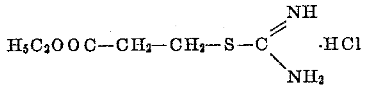 |
| (24) | 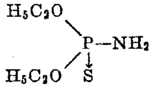 |
| (25) | $H_2N-CH_2-CH_2-S-S-CH_2-CH_2-NH_2 \cdot HCl$ |
| (26) | $H_2N-CO-CH_2-S-S-CH_2-CO-NH_2$ |
| (27) | 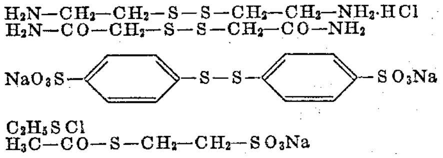 |
| (28) | $C_2H_5SCl$ |
| (29) | $H_3C-CO-S-CH_2-CH_2-SO_3Na$ |
| (30) | 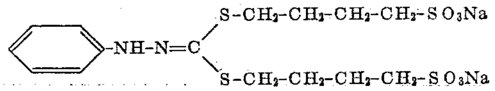 |
| (31) | $H_5C_2-S-CH_2-CH_2-NH_2$ |
| (32) | 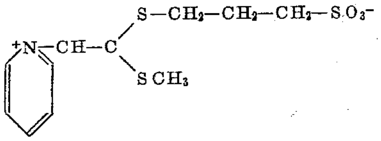 |
| (33) | 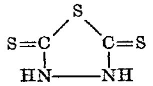 |
| (34) | 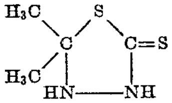 |
| (35) | $H_2N-CS-NH-NH_2$ |
| (36) | $H_2N-CS-NH-NH-CS-NH_2$ |
| (37) | $H_3C-CO-NH-CS-NH_2$ |
| (38) | $H_2N-CS-CS-NH_2$ |
| (39) | $H_3C-CS-NH_2$ |
| (40) | $H_2N-CS-NH_2$ |
| (41) | $H_2C=CH-CH_2-NH-CS-NH_2$ |
| (42) | $(NH_4)_2S_2O_8$ |
| (43) | $Na_2S_2O_3$ |
| (44) | 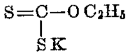 |
| (45) | $K_2CS_3$ |
| (46) | $Na_3AsS_4 \cdot 8H_2O$ |
| (47) | $P_2S_5$ |
| (48) | 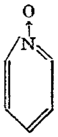 |
| (49) | 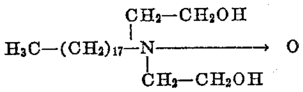 |
| (50) | 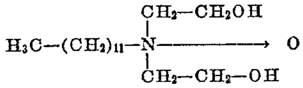 |

Other chemical sensitizing agents particularly suitable for sensitizing the recording material are reducing agents e.g. of the following classes:

(1) aromatic polyhydroxy compound and their reducing derivatives, e.g. alkyl substituted derivatives,
(2) aromatic polyamino compounds and their reducing derivatives, e.g. alkyl substituted derivatives,
(3) aromatic hydroxy-amino compounds and reducing derivatives,
(4) hydrazine and reducing derivatives, and hydroxylamine,
(5) pyrazolidinones,
(6) enol compounds and enamines,
(7) formamidine sulphinic acid and reducing derivatives as described e.g. in the United Kingdom patent specification No. 789,823 and the U.S. patent specification No. 2,983,609,
(8) inorganic reducing agents.

Particularly useful representatives of these reducing agents are listed hereinafter in Table 3.

TABLE 3

| | |
|---|---|
| (1) |  |
| (2) | 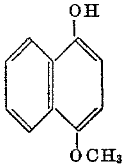 |
| (3) | 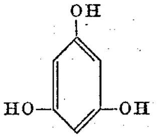 |
| (4) | 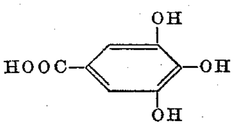 |
| (5) | 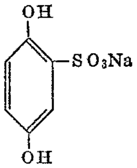 |
| (6) | 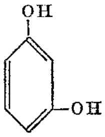 |
| (7) | 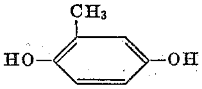 |
| (8) | 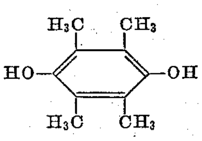 |
| (9) | 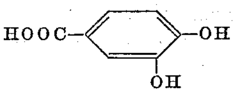 |
| (10) | 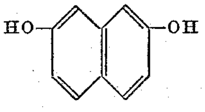 |
| (11) | 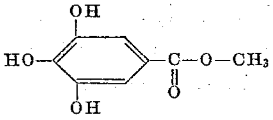 |
| (12) | 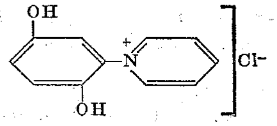 |

TABLE 3—Continued
(13)..... 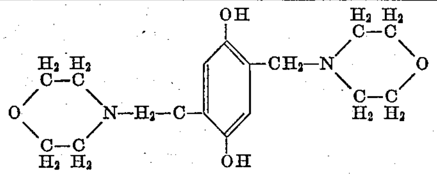
(14)..... 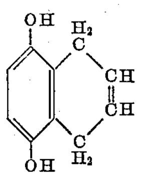
(15)..... 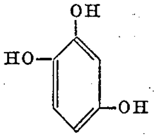
(16)..... 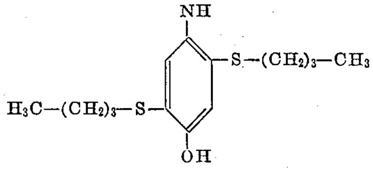
(17)..... 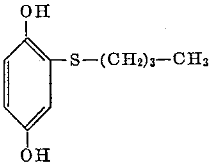
(18)..... 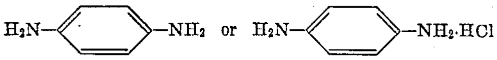
(19)..... 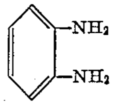
(20)..... 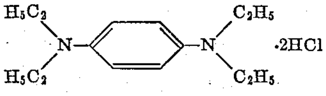
(21)..... 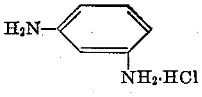
(22)..... 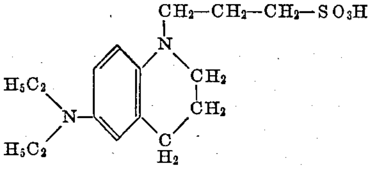
(23)..... 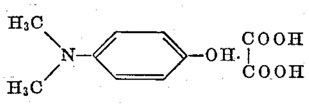
(24)..... 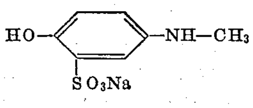
(25)..... 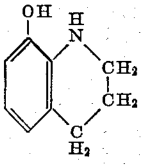
TABLE 3—Continued
(26)..... 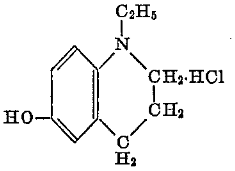
(27)..... 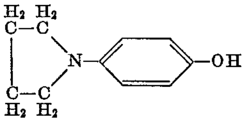
(28)..... 
(29)..... 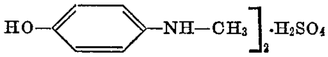
(30)..... 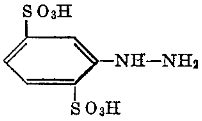
(31)..... $H_2N-NH-COOH \cdot H_2N-NH_2$
(32)..... 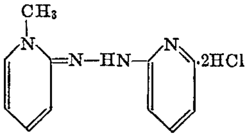
(33)..... 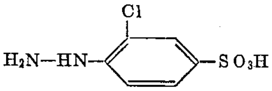
(34)..... $NH_2-OH \cdot HCl$
(35)..... 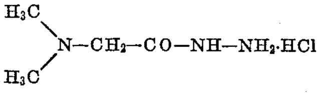
(36)..... 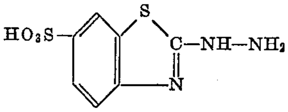
(37)..... $H_2N-NH-COONa$
(38)..... 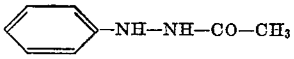
(39)..... $HOCH_2-CH_2-NH-NH_2$
(40)..... $H_3C-NH-NH_2$
(41)..... $H_2N-NH_2 \cdot H_2O$ or $H_2N-NH_2 \cdot H_2SO_4$
(42)..... 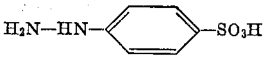
(43)..... 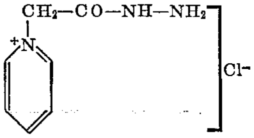
(44)..... 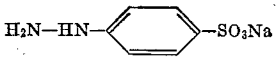
(45)..... $CF_3-CH_2-NH-NH_2$
(46)..... 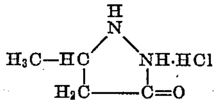

TABLE 3—Continued

(47) ----
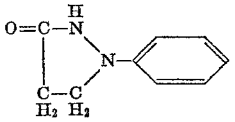

(48) ----
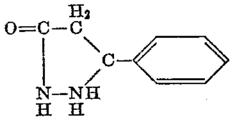

(49) ----
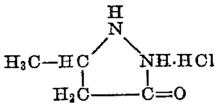

(50) ----
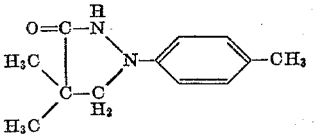

(51) ----
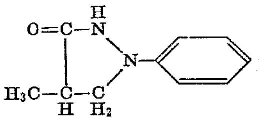

(52) ----
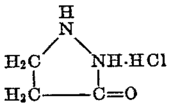

(53) ----
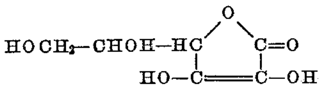

(54) ----
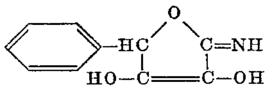

(55) ----
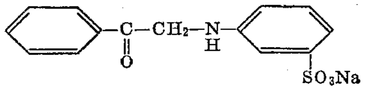

(56) ----
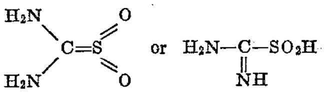

(57) ---- $KAsO_2$

(58) ---- $NaH_2PO_2 \cdot H_2O$

(59) ---- $FeSO_4$

(60) ----
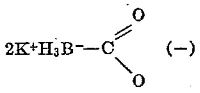

(61) ---- Tin(II)chelate of ethylenediamine tetraacetic acid.

(62) ---- Titanium(III)chelate of ethylenediamine tetraacetic acid.

(63) ---- $SnCl_2 \cdot 2H_2O$

(64) ----
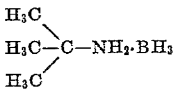

(65) ---- $NaNO_2$

(66) ---- $Ce_2(SO_4)_3$

The sensitizing sulphur and reducing compounds may be applied in a rather large amount in respect of the photosensitive lead compounds, e.g. in a ratio by weight up to 1:2, preferably in a range of 1:100 to 1:1 in respect of the latter.

The chemical sensitizing agents mentioned in Table 3 are preferably used in the same amounts with respect to the photosensitive lead salts as already has been described for the sensitizing sulphur compounds.

The photosensitive lead compounds may be treated with the chemical sensitizers before, during or after the said compounds to a suitable support. Preferably they are added to the coating composition before coating and intimately mixed e.g. ground, therewith or applied in a liquid penetrating into the recording layer so that a chemical interaction can take place.

The binding agents used according to the present invention are preferably of the hydrophilic water-permeable type.

As hydrophilic colloids, hydrophilic natural colloids, modified hydrophilic natural colloids or synthetic hydrophilic colloids may be used. More particularly they may be selected from such film-forming natural or modified natural hydrophilic colloids that do not adversely effect the photographic properties of the light-sensitive lead compound e.g. gelatin, glue, casein, zein, hydroxyethylcellulose, carboxymethylcellulose, hydroxypropylstarch, gum arabic, sodium alginate, and hydrophilic derivatives of such colloids. They may also be selected from synthetic hydrophilic polymers as, e.g. poly(vinyl alcohol), partially acetalized polyvinyl alcohol or partially hydrolyzed polyvinyl acetate, preferably poly(vinyl-n-butyral/vinyl alcohol) containing at least 5 mole of vinyl alcohol units, poly(vinylpyrrolidone), poly(vinyl amide), urea-formaldehyde resin, dimethylolmelamine-formaldehyde resin, poly(ethylene oxide), poly(styrene sulfonic acid), polyacrylamide, copoly(acrylic acid acrylamide sodium acrylate), polyacrylic acid and hydrophilic copolymers and derivatives of such polymers. As hydrophilic and water-permeable colloid, gelatin is preferred.

The hydrophilic binder material used in the recording layer may be hardened to some extent in order to obtain a layer with higher mechanical strength. Thus, e.g., a hydrophilic binding agent of the gelatin type may be hardened by reaction with an aldehyde such as formaldehyde or glyoxal. The hardening agents may be incorporated in the coating by admixing with the coating composition before coating or may be introduced into the coated layer by imbibition. The use of latent hardening agents, from which, e.g. the hardening agent is generated by heating, is not excluded.

The amount and type of hardening agent depends on the mechanical strength desired. When gelatin is used the amount of hardening agent may be in the range of 0.5 to 5% by weight in respect of gelatin. The hardening of the recording layer may be effected with a solution containing the hardening agent e.g. formaldehyde in an amount of 2 to 25% by weight.

The ratio by weight of binding agent to light-sensitive lead compound is preferably between 9:1 and 1:3. The amount of light-sensitive lead compound per sq. m. can vary within wide limits but is preferably at least 1 g. per sq. m.

The flexibility of the recording layer may be improved by means of plasticizing agents known in the art, e.g., latices, and phosphonic or phosphoric acid esters of polyols and/or alkylene glycol monoalkyl ethers and/or polyoxyalkylene glycol monoalkyl ethers.

The support of the recording material securing sufficient mechanical strength to the material may be a paper support, a metal sheet or a synthetic film support, which is either transparent or not. If necessary one or more appropriate subbing layers are applied between the support and the recording layer.

The exposure of recording materials described in the present invention proceeds with active electromagnetic radiation i.e. radiation of a suitable wavelength and intensity for producing a print-out image by means of the described lead iodide or lead(II) oxide. Preferably the exposure proceeds with electromagnetic radiation rich in ultra-violet rays, e.g. produced by a carbon arc lamp or high-pressure mercury vapour tube. When dye-sensitized lead(II) oxide is used, a print-out image can be obtained by using a tungsten filament lamp or a flash lamp mainly emitting in the visible spectrum.

Suitable spectrally sensitizing dyes can be found in the class of the methine dyes known for use in combination with light-sensitive silver halide. Thus, e.g. methine dyes having the following structural formulae:

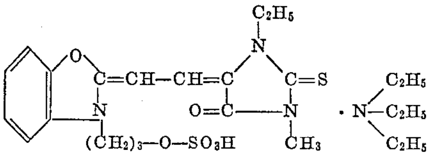

and

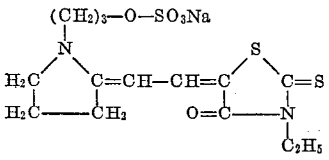

are suitable spectral sensitizing compounds for the yellow lead(II) oxide.

The recording materials of the present invention are suited for the reproduction of halftone and line work and for the recording of signals as are obtained from modulated spot recording systems and recording systems wherein penetrating rays such as X-rays, beta-rays or gamma-rays are applied.

The working contact of the photosensitive lead compound with the reducing agent able to promote the formation of metallic lead on exposure to active electromagnetic radiation is best assured by carrying out the exposure of the recording material in wet state since in that state the reducing properties of the reductor are more intensively used.

Heating of the recording material during the exposure speeds up the formation of the print-out image. Thus, it is possible to produce print-out images with a markedly higher speed, when heating the recording material preferably till or beyond the melting point of the reductor.

According to a special embodiment the reductor is used as a solid state solution in a hydrophilic substance or composition having a melting point below 100° C. e.g. a low melting polyol compound. On heating during the exposure a liquid solution of the reductor in the hydrophilic molten material is formed, so that wetting of the photosensitive lead compound with a reductor solution actually proceeds as a result of the heating.

When the exposure is carried out without previous or simultaneous wetting of the recording layer water-attracting compounds e.g. glycerol are preferably used in the recording layer.

A reducing agent for promoting the formation of the lead metal image and the subsequent formation of the positive copper image is preferably ascorbic acid. This reducing agent is preferably present in the recording layer before the exposure in an amount of 0.01 mole to 2.5 mole per mole of photosensitive lead compound. The reducing agent can be applied by imbibition just before the exposure of the recording layer from a treating bath containing the dissolved reductor in preferred amounts of 1.5 to 300 g. per litre.

In the step following the exposure producing the lead metal image said image is treated with an aqueous solution containing copper(II) ions provided by a water-soluble copper(II) salt such as copper(II) chloride or copper(II) nitrate.

It has been assumed that thereby the following reaction takes place:

$$Pb+2Cu^{++}\rightarrow 2Cu^{+}+Pb^{++}$$

During this treatment the visible lead image disappears, no precipitation of copper metal has been detected when applying ascorbic acid as reductor for promoting the formation of the lead image in the exposure step.

After the diaspearance of the lead image the recording layer containing unreacted copper(II) ions in the unexposed portions is treated with a reductor that can separate free copper metal from a copper(II) sulphate solution, e.g. sodium dithionite. As a result of that treatment a strong positive copper metal image is formed in the unexposed portions and a weak negative image in the exposed portions. The latter result is quite unobvious but a probable explanation of the phenomenon may be that the copper(I) compound formed in the exposed portions is not soluble enough in order to be reduced in a sufficiently large extent to metallic copper. It has been discovered that the positive copper image is formed mainly in the interface between the photosensitive layer and the underlying layer or support.

Since the weak negative image corresponding with the exposed portions impairs the image quality of the positive print one has tried to clean the image background for the positive print.

A way to realize this was found by applying the photosensitive lead compounds in a removable recording layer on a water-permeable interlayer or support into which by the copper(II) ion treatment said ions can penetrate.

The removable recording layer can be formed on the basis of (a) water-soluble hydrophilic colloid(s) that allow(s) the washing away of the recording layer with water.

The positive copper image that initially possess a violet to blue colour is not very stable in contact with the atmosphere. After a few hours the image colour turns to green and light yellow. This can be counteracted by shielding the image from atmospheric oxygen and moisture by means of e.g. a hydrophobic polymeric film that may be applied by sticking thereto or spraying from a resin solution. Another way of image stabilization resides in an after-treatment of the copper image by means of sulphide ions or a sulphur compound containing an easily releasable sulphur atom e.g. the diamide of thioxalic acid (rubeanic acid).

The following examples illustrate the present invention without however limiting it thereto.

The percentages are by weight if not otherwise indicated.

EXAMPLE 1

60 g. of lead(II) iodide were ball-milled for 6 h. in 70 ml. of demineralized water. To the suspension obtained the following ingredients were added and thoroughly mixed therewith:

| | Ml. |
|---|---|
| 15% solution of gelatin in demineralized water | 250 |
| 12.5% solution of saponine in demineralized water | 5 |
| 20% solution of formaldehyde in demineralized water | 5 |
| Demineralized water | 97.5 |

This composition was coated onto an ordinary water-permeable paper support of 60 g. per sq. m. in a proportion of 148 g. per sq. m. and dried. Thereupon the photosensitive material was dipped for 30 sec. in a 1.5% solution of 1-ascorbic acid in demineralized water and immediately thereafter without drying exposed for 2 min. through a transparent original by means of a Philips HPR 125 lamp (trade name) placed at a distance of 30 cm. from the photosensitive material.

The obtained print-out image was bleached completely by dipping the material in a 2% aqueous solution of copper(II) chloride·2 water and finally dipped in a strong reducing agent solution containing per litre 50 g. of sodium dithionite ($Na_2S_2O_4$) and 10 g. of sodium carbonate.

As a result of the last treatment a weak visible negative image and an optically very dense positive image was obtained.

The weak negative image was removed by rinsing the recording material for five minutes in water having a temperature of 50–60° C. A purple positive print of the original on a clear image background was obtained that way.

EXAMPLE 2

60 g. of lead(II) iodide were ball-milled for 6 h. in 70 ml. of demineralized water.

To the suspension obtained the following ingredients where added and thoroughly mixed therewith:

| | | |
|---|---|---|
| 15% solution of gelatin in demineralized water | ml. | 250 |
| Ascorbic acid | g. | 20 |
| Glycerol | ml. | 20 |
| 12.5% solution of saponine in demineralised water | ml. | 5 |
| 20% solution of formaldehyde in demineralised water | ml. | 5 |
| Demineralised water | ml. | 57.5 |

This composition was coated onto a baryta coated photographic paper support of 90 g. per sq. m. in a proportion of 148 g. per sq. m. and dried. The dried photosensitive material was exposed image-wise during 2 min. by means of a Philips HPR 125 lamp (trade name) placed at a distance of 30 cm. from the photosensitive material.

Following the exposure the photosensitive material was treated as described in Example 1.

A purple positive print of the original on a clear image background was obtained.

EXAMPLE 3

60 g. of yellow lead(II) oxide were ball-milled for 6 h. in 70 ml. of demineralised water.

To the suspension obtained were added and thoroughly mixed therewith:

| | Ml. |
|---|---|
| 15% solution of gelatin in demineralised water | 250 |
| Glycerol | 20 |
| 12.5% saponine solution in demineralised water | 5 |
| Demineralised water | 97.5 |

This composition was coated onto a baryta coated photographic paper support of 90 g. per sq. m. in a proportion of 419 g. per sq. m. and dried. Thereupon the photosensitive material was dipped for 60 sec. in a 1.5% solution of ascorbic acid in demineralised water and subsequently exposed through a transparent line original by means of a Philips HPR 125 lamp placed at a distance of 30 cm. from the original.

The print-out image obtained was bleached completely by dipping it for 1 min. in an aqueous solution containing per liter 20 g. of copper(II) chloride·2 water and 20 ml. of a 37% solution of hydrochloric acid.

The bleached material was treated with a solution containing per liter 50 g. of sodium dithionite and 10 g. of sodium carbonate. A positive print on a faintly purple coloured background (negative image) was obtained.

By rinsing the material in luke warm water (60–70° C.) the gelatin containing surface recording layer was removed leaving a blue grey positive copy on a clear white baryta coated paper background.

We claim:

1. A photographic process comprising the successive steps of:

(1) exposing to activating electromagnetic radiation a photosensitive recording material containing a photosensitive orthorhombic lead(II) oxide (massicot) or lead halide capable of separating metallic lead on exposure to such radiation while said photosensitive lead oxide or halide is in working contact with ascorbic acid to promote the formation of metallic lead in the exposed regions thereof, (2) treating the thus obtained metallic lead image with copper(II) ions till the metallic lead image has at least substantially disappeared, and (3) treating the recording material with sodium dithionate to separate metallic copper from an aqueous copper(II) sulphate solution, thereby producing a positive copper image together with a relatively weak negative image.

2. A photographic process according to claim 1 wherein the photosensitive lead oxide or halide is dispersed in a hydrophilic water-permeable binder medium.

3. A photographic process according to claim 2 wherein the binder medium contains gelatin.

4. A photographic process according to claim 1 wherein the photosensitive lead(II) oxide has been used in admixture with a chemical sensitizing agent therefor selected from the group consisting of (A) an organic polyfunctional compound having at least two chemical functional groups, each being selected from a hydroxy, mercapto or a primary or secondary amino group having one of the following:

(1) $X_1—Q_1—X_2$ (2)

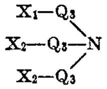

wherein:

each of $X_1$ and $X_2$ stands for —OH, —SH, —NHR, —$CH_2$OH, —$CH_2$SH, —$CH_2$NHR, —COR, —C(R)$_3$, a cyclic amino group, e.g., a

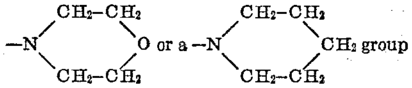

or halogen, $Q_1$ stands for an alkylene radical, a substituted alkylene radical, an alkylene radical interrupted with one or more oxygen or sulphur atom, or with a

—N(R)— group, or a bivalent alkenyl radical, or a

—(CHOH)$_n$— group wherein *n* stands for a positive integer, $X_3$ stands for —OH, —SH, a —NHR, —$CH_2$OH, —$CH_2$SH or a —$CH_2$NHR group, $Q_3$ stands for a lower ($C_1$–$C_5$) alkylene group or a substituted lower alkylene group, R is a hydrogen atom, an aliphatic group, or an aromatic group; or (3) a mono- or oligosaccharide;

(B) a compound that possesses reducing properties and contains a releasable sulphur, selenium or tellurium atom selected from the group consisting of:

(1) thiol compounds or thiolates, (2) compounds corresponding to the following structural formula:

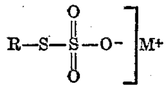

wherein:

$M^+$ represents a cation which is absent when the radical R already contains a positive charge, and R represents an alkyl, aryl, or heterocyclic group, (3) compound yielding $HSO_3^-$ ions, or $SO_3^{--}$ ions, (4) compounds yielding

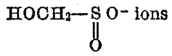

M—O—S—$O^-$ ions wherein M is a cation, or $SO_2^{--}$ ions derived from the hypothetical sulphoxylic acid S(OH)$_2$, (5) compounds yielding $Ar—SO_2—S^-$ ions, wherein Ar represents an aryl group,
(6) compounds yielding $S_2O_4^{--}$ ions,
(7) compounds yielding $SCN^-$ ions,
(8) organic isothiocyanates,
(9) compounds containing a

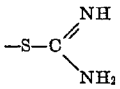
group

(10) compounds containing a

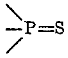
group

(11) compounds containing a —S—S— group,
(12) compounds containing a $—S_x—$ group, wherein $x$ is larger than 2,
(13) compounds containing a $—SR_1$ group, wherein $R_1$ is an acyl, alkyl, aryl, heterocyclic group, or a halogen atom,
(14) compounds containing a —S—CX=N— group wherein X is an amino or an hydrazino group, and said sulphur-containing group makes part of a heterocyclic ring or ring system,
(15) compounds containing a

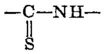
group

(16) compounds yielding $S_2O_3^{--}$ ions,
(17) xanthates,
(18) thiosalts of As, Sb or Sn,
(19) compounds yielding $S^{--}$ ions or $M—S^-$ ions, wherein M is a cation,
(20) selenium or tellurium compounds that contain a releasable selenium or tellurium atom,
(21) oxyacids, wherein one or more of the oxygen atoms has been replaced by a selenium or tellurium atom,
(22) N-oxide compounds,
(23) compounds selected from the group consisting of $H_2N—CH_2—COOH$, pyridine, tetraalkylammonium hydroxides, benzaldehyde and its halo-derivatives; or (C) a reducing agent identified in Table 3 of the specification.

5. A photographic process according to claim 1 wherein the photosensitive recording material is exposed in wet state.

6. A photographic process according to claim 1 wherein the copper image is given an after-treatment to stabilize the same with a sulphur compound containing an easily releasable sulphur atom.

7. A photographic process according to claim 1 wherein the photosensitive lead compound is contained in a removable recording layer disposed on a water-permeable interlayer or support, and after step (3) the recording layer is removed leaving a positive copper image on the interlayer or support.

References Cited

UNITED STATES PATENTS

| | | | |
|---|---|---|---|
| 2,414,839 | 1/1947 | Schoen | 96—88 |
| 1,939,232 | 12/1933 | Sheppard et al. | 96—88 |
| 3,512,972 | 5/1970 | Case | 96—48 PD |
| 3,390,998 | 7/1968 | Cole | 96—48 PD |

FOREIGN PATENTS

| | | | |
|---|---|---|---|
| 1,043,250 | 9/1966 | Great Britain | 96—48 PD |

NORMAN G. TORCHIN, Primary Examiner

W. H. LOWE, Jr., Assistant Examiner

U.S. Cl. X.R.

96—88